United States Patent
Kurihara et al.

(10) Patent No.: US 9,093,578 B2
(45) Date of Patent: Jul. 28, 2015

(54) SOLID-STATE IMAGE SENSOR, METHOD OF MANUFACTURING THE SAME, AND CAMERA

(71) Applicant: CANON KABUSHIKI KAISHA, Tokyo (JP)

(72) Inventors: Masaki Kurihara, Koza-gun (JP); Daisuke Shimoyama, Aiko-gun (JP)

(73) Assignee: Canon Kabushiki Kaisha, Tokyo (JP)

(*) Notice: Subject to any disclaimer, the term of this patent is extended or adjusted under 35 U.S.C. 154(b) by 261 days.

(21) Appl. No.: 13/911,339

(22) Filed: Jun. 6, 2013

(65) Prior Publication Data

US 2013/0335590 A1 Dec. 19, 2013

(30) Foreign Application Priority Data

Jun. 15, 2012 (JP) ................................. 2012-136304

(51) Int. Cl.
| | |
|---|---|
| H04N 5/335 | (2011.01) |
| H04N 5/228 | (2006.01) |
| H01L 27/00 | (2006.01) |
| H01L 31/062 | (2012.01) |
| H01L 31/0232 | (2014.01) |
| H01L 27/146 | (2006.01) |

(52) U.S. Cl.
CPC ...... H01L 31/02325 (2013.01); H01L 27/1462 (2013.01); H01L 27/14627 (2013.01); H01L 27/14685 (2013.01)

(58) Field of Classification Search
CPC .. H04N 5/335; H04N 9/045; H01L 27/14643; H01L 27/14665; H01L 27/14632
USPC ............. 348/222.1, 273, 272, 294; 257/432, 257/291, 292, 294, 440, 443–448; 250/208.1

See application file for complete search history.

(56) References Cited

U.S. PATENT DOCUMENTS

| | | | |
|---|---|---|---|
| 7,166,484 B2* | 1/2007 | Lee | 438/29 |
| 2008/0042227 A1* | 2/2008 | Asano et al. | 257/432 |
| 2010/0066876 A1* | 3/2010 | Kurihara | 348/273 |
| 2011/0068424 A1* | 3/2011 | Gambino et al. | 257/432 |

FOREIGN PATENT DOCUMENTS

JP 2003-229551 A 8/2003

* cited by examiner

*Primary Examiner* — Sinh Tran
*Assistant Examiner* — Xi Wang
(74) *Attorney, Agent, or Firm* — Fitzpatrick, Cella, Harper & Scinto

(57) ABSTRACT

A method of manufacturing a solid-state image sensor includes preparing a structure including a photoelectric converter formed in an image sensing region and a pad electrode formed in a pad region, forming a first organic film including a first organic portion arranged in the image sensing region of the structure in the image sensing region and the pad region, forming a color filter layer on the first organic portion, forming a second organic film in the image sensing region and the pad region, forming an inorganic film in the image sensing region and the pad region, and etching the inorganic film, the second organic film, and the first organic film so as to form an opening which communicates with the pad electrode.

19 Claims, 9 Drawing Sheets

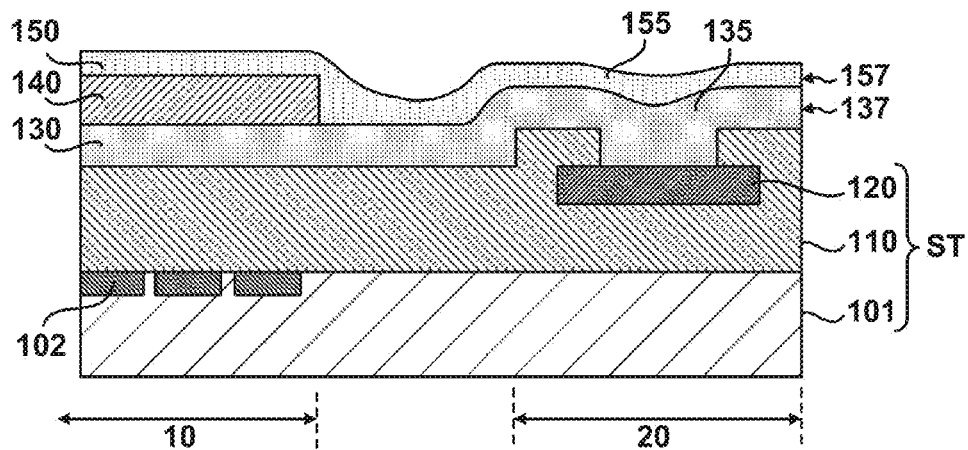

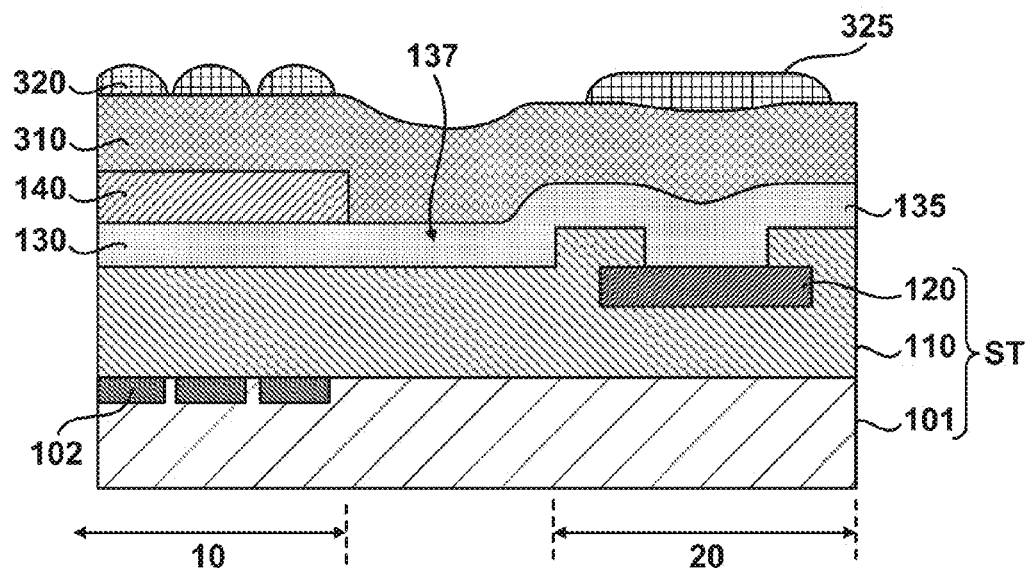
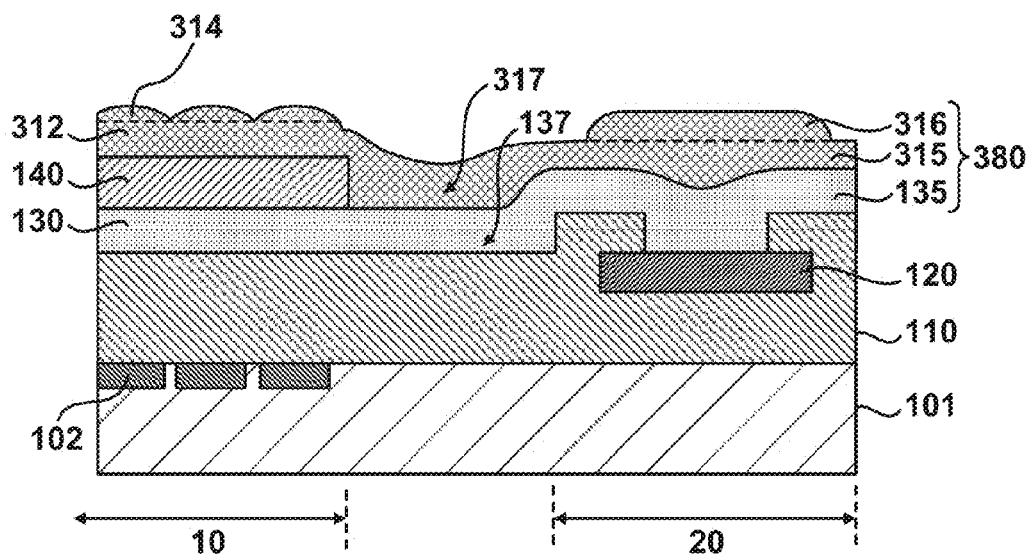

SOLID-STATE IMAGE SENSOR, METHOD OF MANUFACTURING THE SAME, AND CAMERA

BACKGROUND OF THE INVENTION

1. Field of the Invention

The present invention relates to a solid-state image sensor, a method of manufacturing the same, and a camera.

2. Description of the Related Art

Japanese Patent Laid-Open No. 2003-229551 describes a solid-state image sensor which has a planarizing film arranged on a semiconductor substrate including a photoelectric conversion region and pad portion, a color filter film arranged on the planarizing film, and an on-chip microlens arranged on the color filter film. An opening is formed in a layer of the on-chip microlens and the planarizing film so as to expose the pad portion.

In recent years, as a pixel size is reduced, an amount of light which enters each photoelectric converter is decreased. Hence, in order to enhance an intensity of light entering each photoelectric converter, an antireflection film is formed on the surface of a microlens. However, after an inorganic film which forms the antireflection film was formed on an organic film which forms the microlens, when the inorganic film and organic film were plasma-etched to expose the pad portion, an insulation breakdown phenomenon of the organic film was observed although it occurred at a very low probability. This insulation breakdown may damage the pad portion. According to experiments of the present inventors, it was revealed that the insulation breakdown of the organic film occurred immediately after the inorganic film was penetrated by plasma etching. The present inventors estimated that the insulation breakdown of the organic film was caused since a breakdown voltage of the organic film was much lower than that of the inorganic film, a resist pattern formed on the inorganic film was charged by plasma, and a high voltage was applied between the resist pattern and pad portion. More specifically, the present inventors estimated that a high voltage was applied to the organic film below the inorganic film at an instance when the inorganic film was penetrated, thus causing the insulation breakdown of the organic film, and damaging the pad portion below the organic film. Also, the same problem may be posed not exclusively for an antireflection film but when an inorganic film is formed on a microlens formed of an organic substance. As such example, the problem occurs, for example, when a protection film or a planarizing film for implementation is formed.

SUMMARY OF THE INVENTION

The present invention provides a technique which is advantageous for improvement of a manufacturing yield in an arrangement in which an inorganic film is formed on a microlens.

One of aspects of the present invention provides a method of manufacturing a solid-state image sensor including an image sensing region and a pad region, comprising the steps of: preparing a structure including a photoelectric converter formed in the image sensing region and a pad electrode formed in the pad region; forming a first organic film including a first organic portion arranged in the image sensing region of the structure in the image sensing region and the pad region; forming a color filter layer on the first organic portion; forming a second organic film in the image sensing region and the pad region so as to cover the color filter layer; forming an inorganic film in the image sensing region and the pad region so as to cover the second organic film; and etching the inorganic film, the second organic film, and the first organic film so as to form an opening which communicates with the pad electrode, wherein in the step of etching the inorganic film, the second organic film, and the first organic film, at least the inorganic film is etched by plasma etching, the second organic film includes a second organic portion arranged in the image sensing region to cover the color filter layer, a microlens arranged on the second organic portion, and a portion arranged in the pad region, and a depth of an upper face of the pad electrode with respect to an upper face of the second organic film in the pad region is larger than a total of a thickness of the first organic portion and a thickness of the second organic portion.

Further features of the present invention will become apparent from the following description of exemplary embodiments with reference to the attached drawings.

BRIEF DESCRIPTION OF THE DRAWINGS

FIGS. 1A to 1F are views for exemplarily explaining a method of manufacturing a solid-state image sensor according to the first embodiment;

FIGS. 2A to 2F are views for exemplarily explaining a method of manufacturing a solid-state image sensor according to the second embodiment.

DESCRIPTION OF THE EMBODIMENTS

Embodiments of the present invention will be described hereinafter with reference to the accompanying drawings. An example of an arrangement in which an inorganic film arranged on a microlens is used as an antireflection film will be explained below. Since the same problem occurs not exclusively for an antireflection film but when an inorganic film is formed on a microlens formed of an organic substance, the present invention is applicable to such case. As such example, the problem occurs when a protection film or a planarizing film for implementation is formed.

Figure 1C:
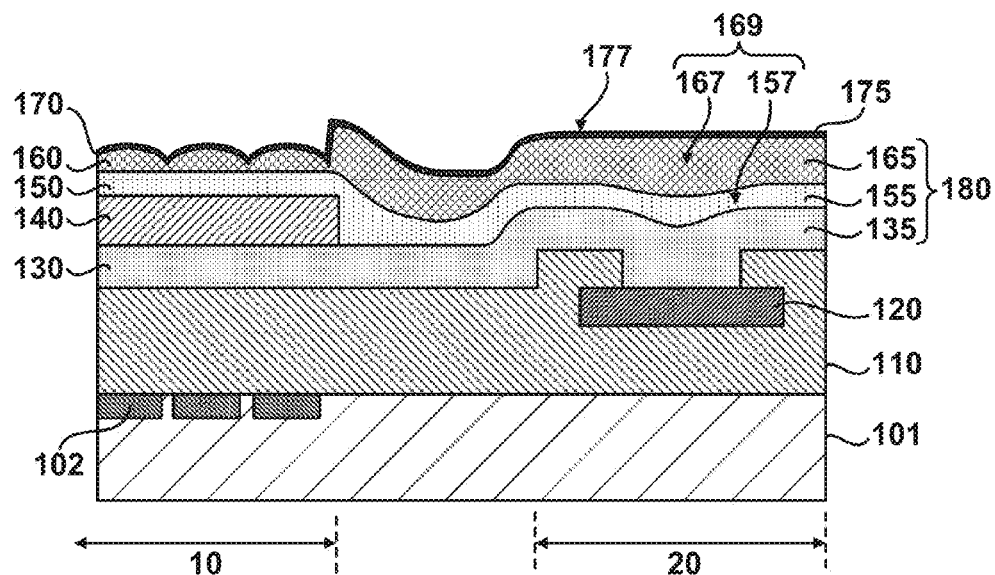
Figure 1D:
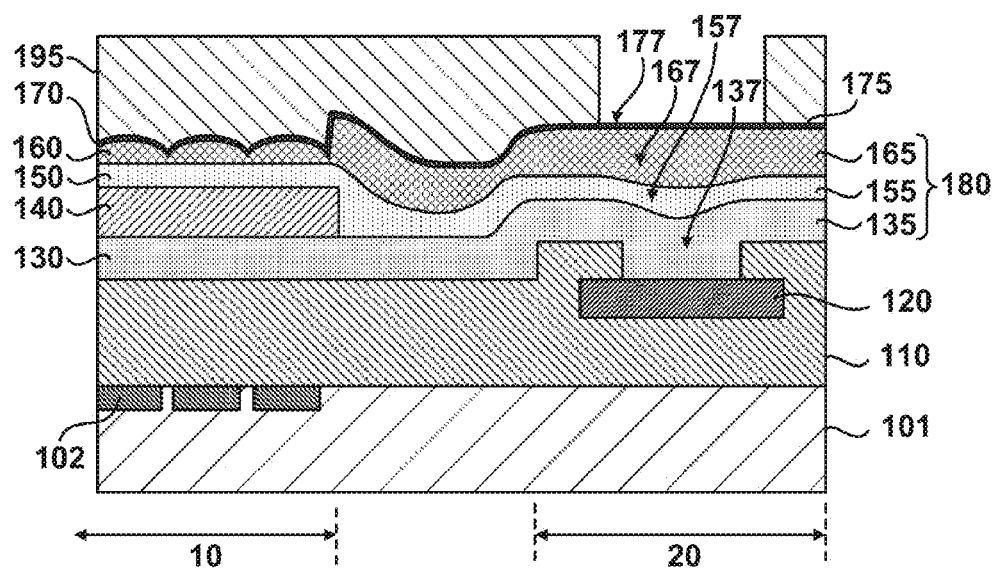
Figure 1E:
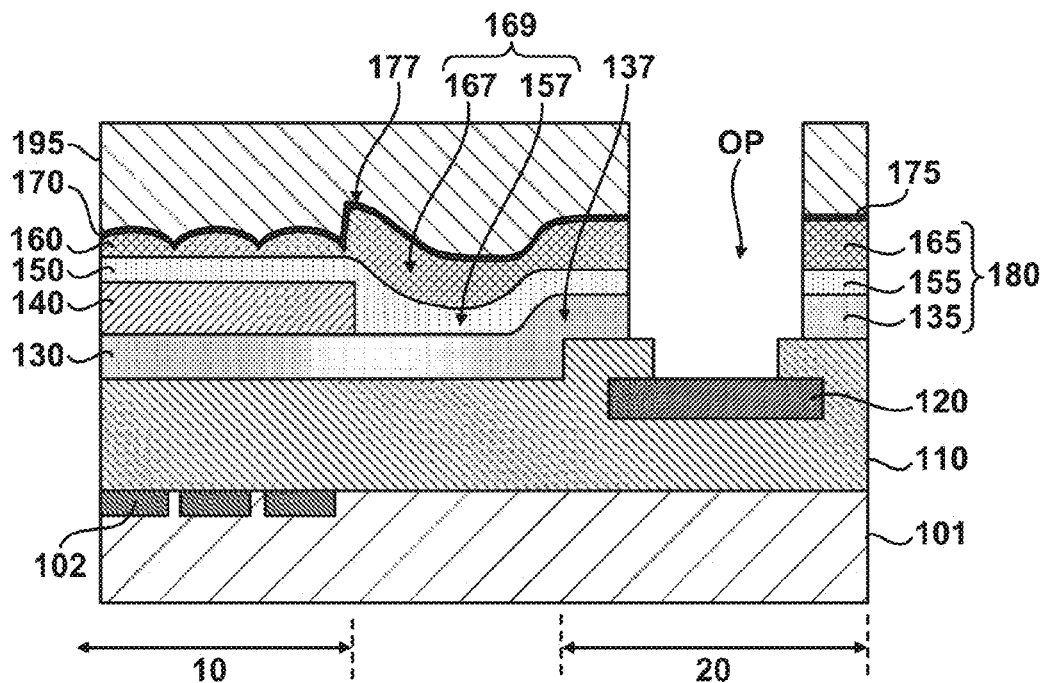
Figure 1F:
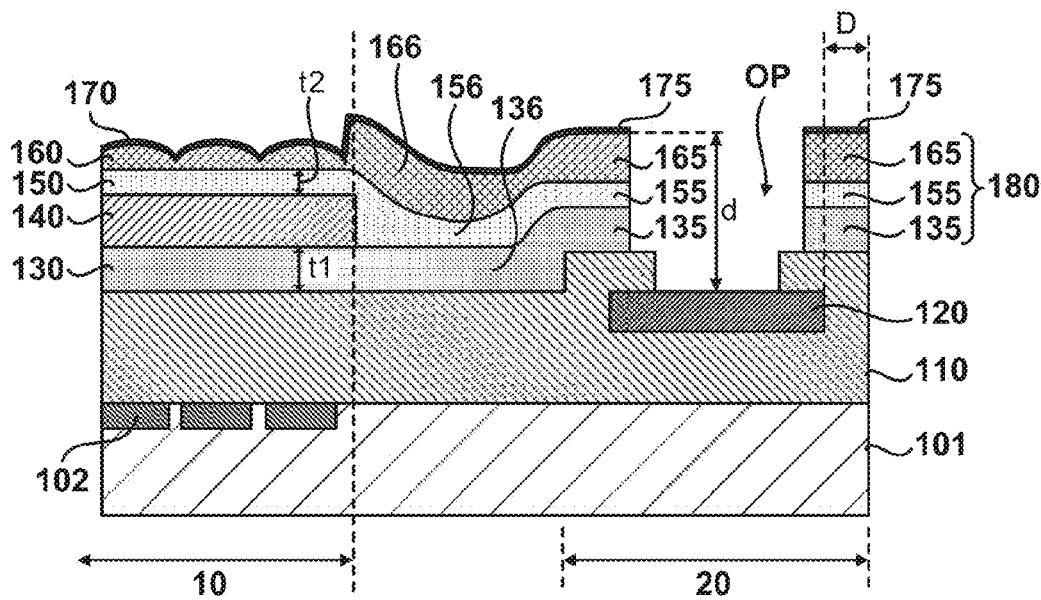

FIG. 1F is a sectional view showing the arrangement of a solid-state image sensor according to the first embodiment of the present invention. The solid-state image sensor of the first embodiment is formed on a semiconductor substrate 101, and has an image sensing region 10 and pad region 20. The image sensing region 10 includes photoelectric converters 102, a wiring structure 110, a first organic portion 130, a color filter layer 140, a second organic portion 150, a microlens 160, and an inorganic film 170. The photoelectric converters 102 are formed on the semiconductor substrate 101. The wiring structure 110 is arranged on the photoelectric converters 102, and includes a plurality of wiring layers although not shown.

The first organic portion 130 is arranged on the wiring structure 110. The color filter layer 140 is arranged on the first organic portion 130. The second organic portion 150 is arranged on the color filter layer 140. The microlens 160 is arranged on the second organic portion 150. The inorganic film 170 is formed on the microlens 160 and functions as an antireflection film.

The pad region 20 has a wiring structure 110 including a pad electrode 120. The wiring structure 110 of the image sensing region 10 and that of the pad region 20 can have a common interlayer insulating film. The pad region 20 also includes an organic film 180 arranged on the pad electrode 120, and a cover film (inorganic film) 175 which is arranged on the organic film 180 and is made up of the same material as the inorganic film 170. In the organic film 180 and cover film 175, an opening OP required to expose the pad electrode 120 is formed.

A depth d of an upper face of the pad electrode 120 with respect to that of the organic film 180 is larger than a total (t1+t2) of a thickness t1 of the first organic portion 130 and a thickness t2 of the second organic portion 150. That is, a relation d>t1+t2 holds. To hold such relation is advantageous to reduce a probability of causing an insulation breakdown of the organic film 180 to damage the pad electrode 120 in an etching process required to form the opening OP in the organic film 180 and cover film 175. The depth d is preferably, for example, not less than 1 μm.

A distance D between an outer edge of the pad electrode 120 and that of the organic film 180 in a planar view is preferably not less than 1 μm. Note that the outer edge of the organic film 180 can be defined as that of a region which satisfies d>t1+t2.

The organic film 180 can include a first portion 135, a second portion 155 arranged on the first portion 135, and a third portion 165 arranged on the second portion 155. In the example shown in FIG. 1F, the second portion 155 is arranged to contact the first portion 135.

Although not shown, the organic film 180 may include the color filter layer 140 in place of all or some of the first, second, and third portions 135, 155, and 165 or in addition to the first, second, and third portions 135, 155, and 165. The first portion 135 can be formed of the same material as the first organic portion 130. The second portion 155 can be formed of the same material as the second organic portion 150. The third portion 165 can be formed of the same material as the microlens 160. The first portion 135 can be formed simultaneously with the first organic portion 130. The second portion 155 can be formed simultaneously with the second organic portion 150. The third portion 165 can be formed simultaneously with the microlens 160.

The first organic portion 130 and first portion 135 can be coupled via a portion 136 made of the same material as that which forms them. The second organic portion 150 and second portion 155 can be coupled via a portion 156 made of the same material as that which forms them. The microlens 160 and third portion 165 can be coupled via a portion 166 made of the same material as that which forms them.

The inorganic film 170 and cover film 175 can be made of silicon oxide or silicon nitride. Alternatively, the inorganic film 170 and cover film 175 may include a plurality of films. The plurality of films can include, for example, a silicon oxide film and silicon nitride film.

A method of manufacturing the solid-state image sensor according to the first embodiment will be exemplarily explained below with reference to FIGS. 1A to 1F. In a process shown in FIG. 1A, a structure ST which includes the photoelectric converters 102 formed in the image sensing region 10 and the pad electrode 120 formed in the pad region 20 is prepared. In this case, the photoelectric converters 102 are formed in the semiconductor substrate 101, and the pad electrode 120 is formed in the wiring structure 110 arranged on the semiconductor substrate 101.

In the process shown in FIG. 1A, a first organic film 137 which includes the first organic portion 130 arranged in the image sensing region 10 and the first portion 135 arranged in the pad region 20 in the structure ST is formed. The first organic film 137 functions as a planarizing layer. The first organic film 137 can be made of, for example, an acrylic-based resin. In the process shown in FIG. 1A, the color filter layer 140 is formed on the first organic portion 130 of the first organic film 137. In this case, the color filter layer 140 may also be formed on the first portion 135 of the first organic film 137. In the process shown in FIG. 1A, an organic film 157 is formed in the image sensing region 10 and pad region 20 so as to cover the color filter layer 140. The organic film 157 includes the second organic portion 150 arranged on the color filer layer 140 on the image sensing region 10 and the second portion 155 arranged in the pad region 20. The organic film 157 functions as a planarizing layer. The organic film 157 can be made of, for example, an acrylic-based resin.

In a process shown in FIG. 1B, a microlens layer 167 is formed on the organic film 157. The microlens layer 167 includes the microlens 160 arranged in the image sensing region 10, and the third portion 165 arranged in the pad region 20. The microlens layer 167 can be made of, for example, a polyhydroxystyrene-based resin. Since the microlens layer 167 is made of an organic substance, a stacked structure of the organic film 157 and microlens layer 167 can be recognized as a second organic film 169. Also, a stacked structure including the first portion 135, the second portion 155 arranged on the first portion 135, and the third portion 165 arranged on the second portion 155 can be recognized as an organic film 180.

The microlens layer 167 can be formed by a photolithography process using a photomask 200. The photomask 200 can include an area modulation pattern 210 used to form the microlens 160 and a light-shielding portion 220 which light-shields a portion where the third portion 165 is to be formed. The photolithography process can include a process for coating a photosensitive material on the organic film 157, a process for exposing the photosensitive material using the photomask 200, a process for developing the photosensitive material, a bleaching process, and a bake process.

In a process shown in FIG. 1C, an inorganic film 177 is formed on the microlens layer 167. That is, in the process shown in FIG. 10, the inorganic film 177 is formed to cover the second organic film 169 formed by the organic film 157 and the microlens layer 167. The inorganic film 177 includes the inorganic film 170 arranged in the image sensing region 10 and the cover film 175 arranged in the pad region 20. The inorganic film 177 can be made of, for example, silicon oxide or silicon nitride. Alternatively, the inorganic film 177 may include a plurality of films. The plurality of films can include, for example, a silicon oxide film and silicon nitride film.

In a process shown in FIG. 1D, a resist pattern 195 is formed on the inorganic film 177. In a process shown in FIG. 1E, using the resist pattern 195 as an etching mask, the inorganic film 177, organic film 157, and first organic film 137 are etched to form the opening OP which communicates with the pad electrode 120.

In this case, the inorganic film 177 is etched by plasma etching. The plasma etching of the inorganic film 177 can comply with, for example, conditions 1 below:
<Conditions 1>
Etching gas: $CF_4/Ar$
Power: 200 to 1,500 (W)
Pressure: 30 to 230 (mTorr)
Time: 40 to 120 (sec)

According to conditions 1, the etching can be stopped at the upper face of the second organic film 169. Alternatively, the etching may be stopped after an elapse of a predetermined period of time.

The second organic film 169 and first organic film 137 are also preferably etched by plasma etching. The plasma etching of the second organic film 169 and first organic film 137 can comply with, for example conditions 2 below. However, the second organic film 169 and first organic film 137 may be etched by another etching method such as wet etching.

<Conditions 2>
Etching gas: $O_2/N_2/Ar$
Power: 300 to 1,500 (W)
Pressure: 1,000 to 2,000 (mTorr)
Time: 120 to 250 (sec)

According to conditions 2, the etching is stopped at the pad electrode 120. After that, the resist pattern 195 is removed. As a result, the solid-state image sensor shown in FIG. 1F is obtained.

Figure 2C:
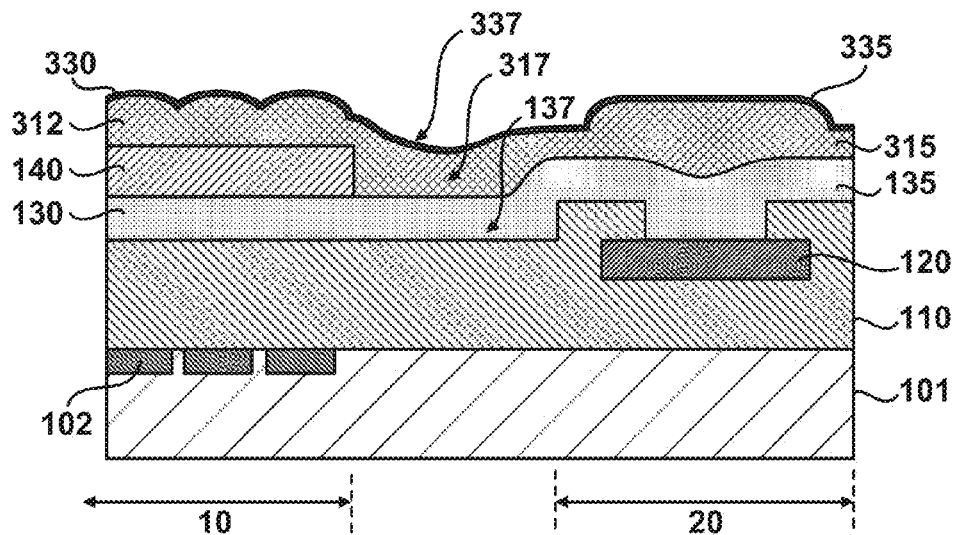
Figure 2D:
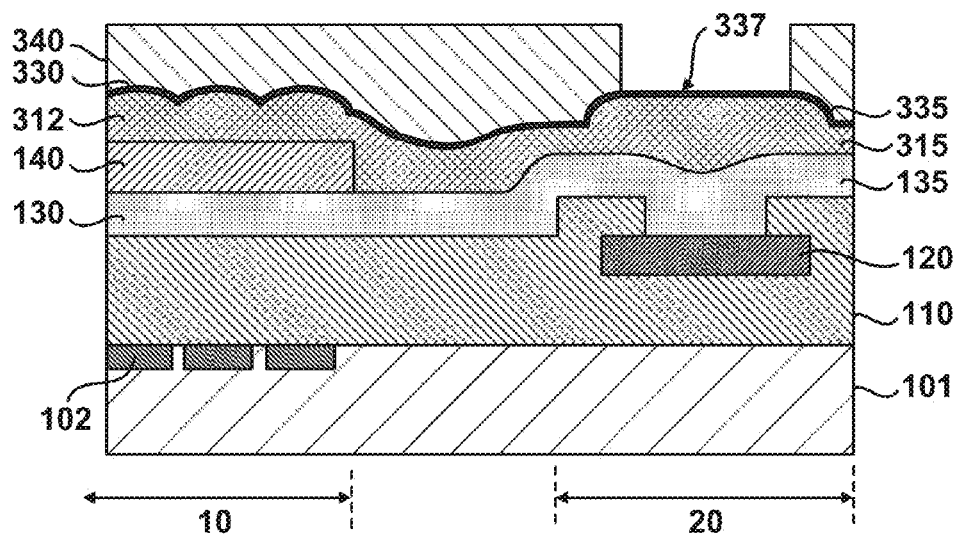
Figure 2E:
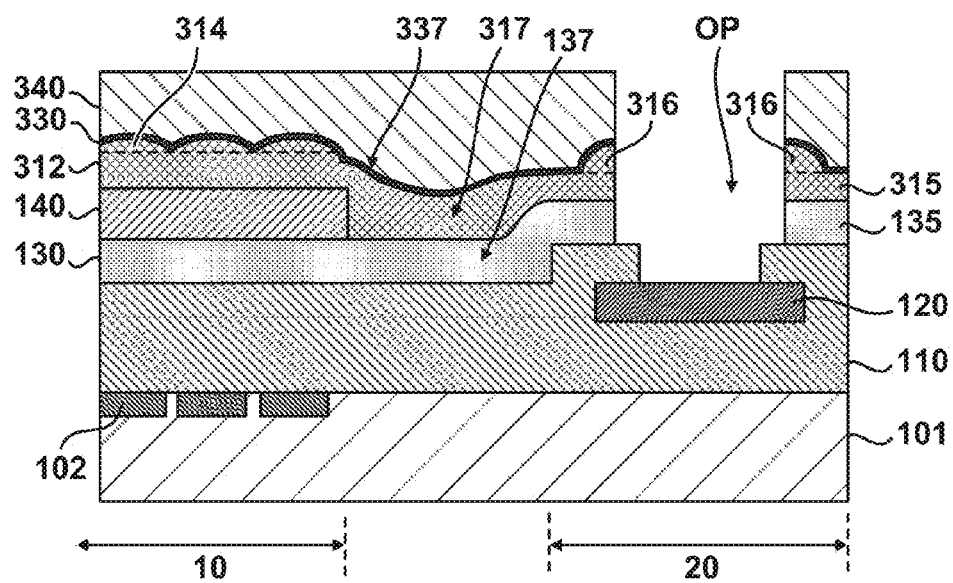
Figure 2F:
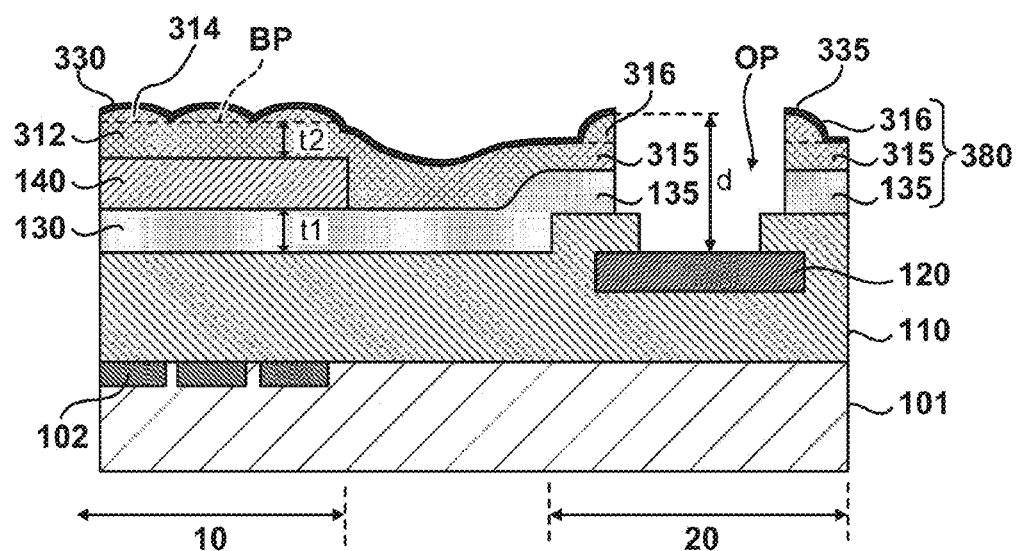

FIG. 2F is a sectional view showing the arrangement of a solid-state image sensor according to the second embodiment of the present invention. The solid-state image sensor of the second embodiment is formed on a semiconductor substrate 101, and has an image sensing region 10 and pad region 20. The image sensing region 10 includes photoelectric converters 102, a wiring structure 110, a first organic portion 130, a color filter layer 140, a second organic portion 312, a microlens 314, and an inorganic film 330. The photoelectric converters 102 are formed on the semiconductor substrate 101. The wiring structure 110 is arranged on the photoelectric converters 102, and includes a plurality of wiring layers although not shown.

The first organic portion 130 is arranged on the wiring structure 110. The color filter layer 140 is arranged on the first organic portion 130. The second organic portion 312 is arranged on the color filter layer 140. The microlens 314 is arranged on the second organic portion 312. The second organic portion 312 and microlens 314 are made of the same material. A boundary between the second organic portion 312 and microlens 314 can be considered as a lower end of a lens effect portion of the microlens 314, that is, a plane BP including boundaries between neighboring microlens portions 314. The inorganic film 330 is formed on the microlens 314 and functions as an antireflection film.

The pad region 20 has a wiring structure 110 including a pad electrode 120. The wiring structure 110 of the image sensing region 10 and that of the pad region 20 can have a common interlayer insulating film. The pad region 20 also includes an organic film 380 arranged on the pad electrode 120, and a cover film (inorganic film) 335 which is arranged on the organic film 380 and is made of the same material as the inorganic film 330. In the organic film 380 and cover film 335, an opening OP required to expose the pad electrode 120 is formed.

A depth d of an upper face of the pad electrode 120 with respect to that of the organic film 380 is larger than a total (t1+t2) of a thickness t1 of the first organic portion 130 and a thickness t2 of the second organic portion 312. That is, a relation d>t1+t2 holds. To hold such relation is advantageous to reduce a probability of causing an insulation breakdown of the organic film 380 to damage the pad electrode 120 in an etching process required to form the opening OP in the organic film 380 and cover film 335. The depth d is preferably, for example, not less than 1 μm.

A distance between an outer edge of the pad electrode 120 and that of the organic film 380 in a planar view is preferably not less than 1 μm. Note that the outer edge of the organic film 380 can be defined as that of a region which satisfies d>t1+t2.

The organic film 380 can include a first portion 135, a second portion 315 arranged on the first portion 135, and a third portion 316 arranged on the second portion 315. In the example shown in FIG. 2F, the second portion 315 is arranged to contact the first portion 135.

Although not shown, the organic film 380 may include the color filter layer 140 in place of all or some of the first, second, and third portions 135, 315, and 316 or in addition to the first, second, and third portions 135, 315, and 316. The first portion 135 can be made of the same material as the first organic portion 130. The second portion 315, third portion 316, second organic portion 312, and microlens 314 can be made of the same material. The first portion 135 can be formed simultaneously with the first organic portion 130. The second portion 315, third portion 316, second organic portion 312, and microlens 314 can be formed etching an organic film which forms them.

The first organic portion 130 and first portion 135 can be coupled via a portion made of the same material as that which forms them. The second organic portion 312 and second portion 315 can be coupled via a portion made of the same material as that which forms them.

The inorganic film 330 and cover film 335 can be made of silicon oxide or silicon nitride. Alternatively, the inorganic film 330 and cover film 335 may include a plurality of films. The plurality of films can include, for example, a silicon oxide film and silicon nitride film.

A method of manufacturing the solid-state image sensor according to the second embodiment will be exemplarily explained below with reference to FIGS. 2A to 2F. In a process shown in FIG. 2A, a structure ST which includes the photoelectric converters 102 formed in the image sensing region 10 and the pad electrode 120 formed in the pad region 20 is prepared. In this case, the photoelectric converters 102 are formed in the semiconductor substrate 101, and the pad electrode 120 is formed in the wiring structure 110 arranged on the semiconductor substrate 101.

In the process shown in FIG. 2A, a first organic film 137 which includes the first organic portion 130 arranged in the image sensing region 10 and the first portion 135 in the structure ST is formed in the image sensing region 10 and pad region 20. The first organic film 137 functions as a planarizing layer. The first organic film 137 can be made of, for example, an acrylic-based resin. In the process shown in FIG. 2A, the color filter layer 140 is formed on the first organic portion 130 of the first organic film 137. In this case, the color filter layer 140 may also be formed on the first portion 135 of the first organic film 137.

In the process shown in FIG. 2A, an organic film 310 is formed in the image sensing region 10 and pad region 20 so as to cover the color filter layer 140, and masks 320 and 325 are formed on the organic film 310. The organic film 310 can be made of, for example, a polyhydroxystyrene-based resin. The mask 320 is used to form the microlens 314, and the mask 325 is used to form the third portion 316. The masks 320 and 325 are formed by, for example, a reflow method.

In a process shown in FIG. 2B, the organic film 310 is etched together with the masks 320 and 325 to form a second organic film 317 including the second organic portion 312, microlens 314, second portion 315, and third portion 316. A portion including the first portion 135, the second portion 315 arranged on the first portion 135, and the third portion 316 arranged on the second portion 315 can be recognized as the organic film 380.

In a process shown in FIG. 2C, an inorganic film 337 is formed to cover the second organic film 317. The inorganic film 337 includes the inorganic film 330 arranged in the image sensing region 10 and the cover film 335 arranged in the pad region 20. The inorganic film 337 can be made of, for example, silicon oxide or silicon nitride. Alternatively, the inorganic film 337 may include a plurality of films. The plurality of films can include, for example, a silicon oxide film and silicon nitride film.

In a process shown in FIG. 2D, a resist pattern 340 is formed on the inorganic film 337. In a process shown in FIG. 2E, using the resist pattern 340 as an etching mask, the inorganic film 337, second organic film 317, and first organic film 137 are etched to form the opening OP which communicates with the pad electrode 120.

In this case, the inorganic film 337 is etched by plasma etching. The plasma etching of the inorganic film 337 can comply with, for example, conditions 1 below:

<Conditions 1>
Etching gas: $CF_4/Ar$
Power: 200 to 1,500 (W)
Pressure: 30 to 230 (mTorr)
Time: 40 to 120 (sec)

According to conditions 1, the etching can be stopped at the upper face of the second organic film 317. Alternatively, the etching may be stopped after an elapse of a predetermined period of time.

The second organic film 317 and first organic film 137 are also preferably etched by plasma etching. The plasma etching of the second organic film 317 and first organic film 137 can comply with, for example conditions 2 below. However, the second organic film 317 and first organic film 137 may be etched by another etching method such as wet etching.

<Conditions 2>
Etching gas: $O_2/N_2/Ar$
Power: 300 to 1,500 (W)
Pressure: 1,000 to 2,000 (mTorr)
Time: 120 to 250 (sec)

According to conditions 2, the etching is stopped at the pad electrode 120. After that, the resist pattern 340 is removed. As a result, the solid-state image sensor shown in FIG. 2F is obtained.

Figures 3A, 3B:
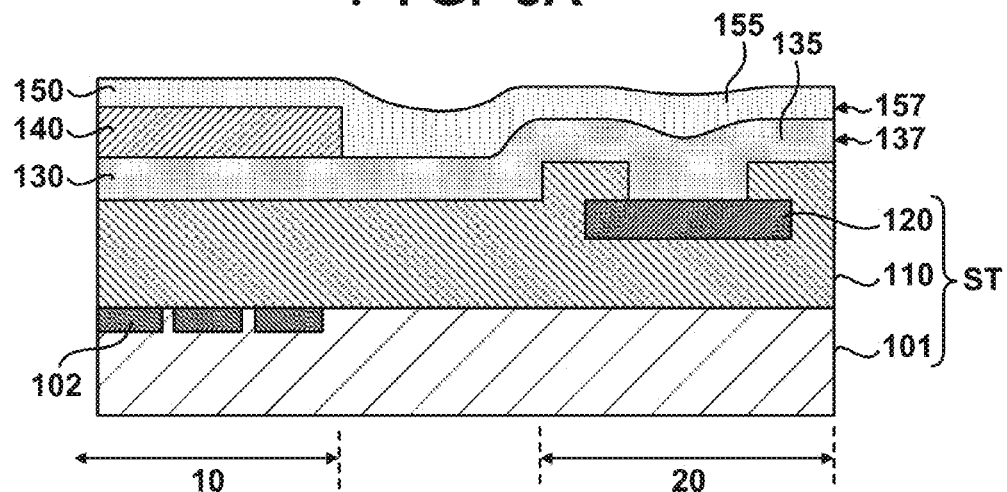
FIGS. 3A to 3F are views for exemplarily explaining a method of manufacturing a solid-state image sensor according to the third embodiment.
Figure 3C:
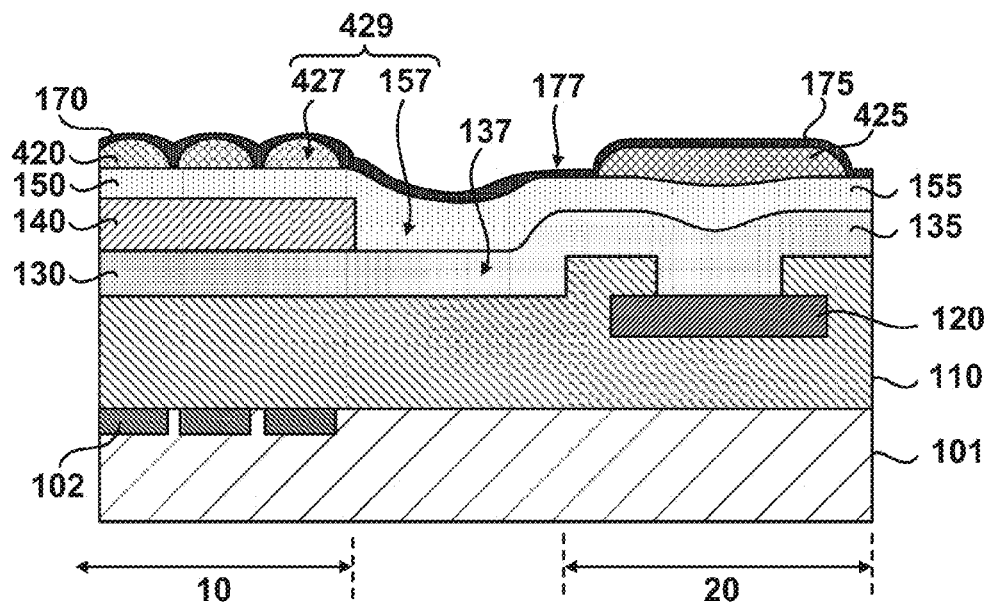
Figure 3D:
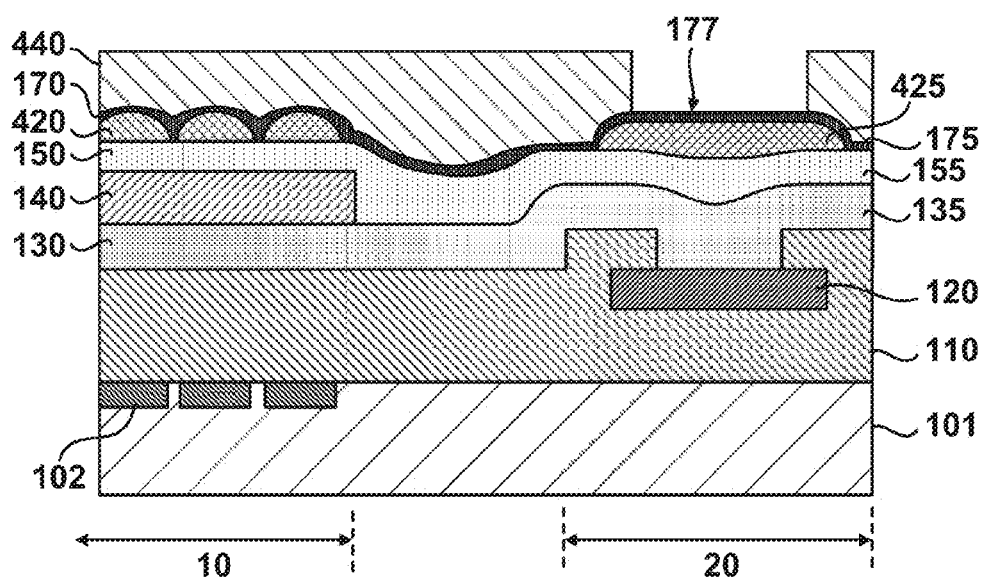
Figure 3E:
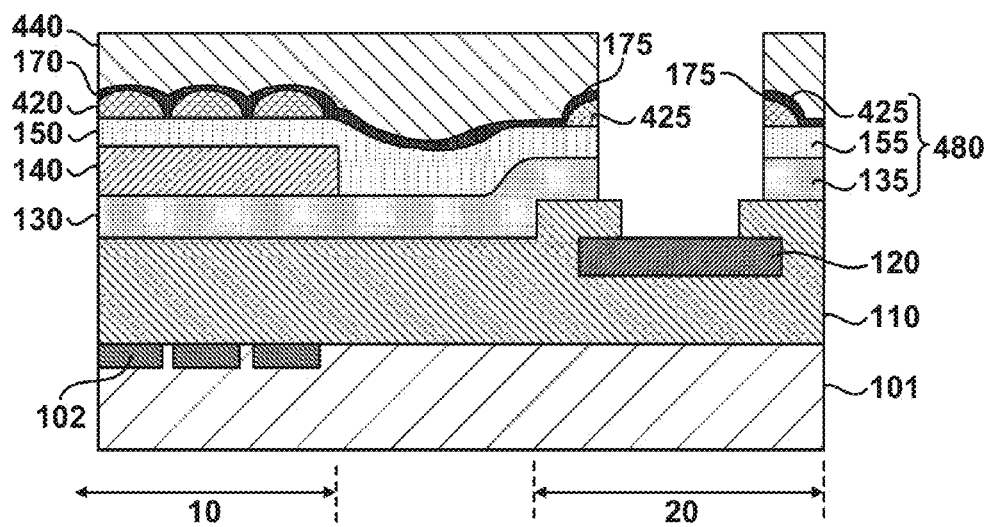
Figure 3F:
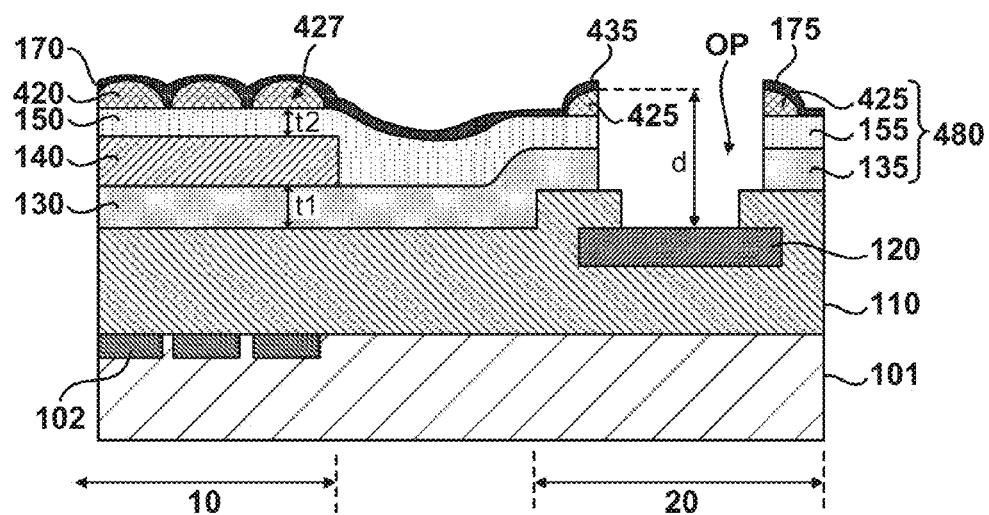

FIG. 3F is a sectional view showing the arrangement of a solid-state image sensor according to the third embodiment of the present invention. The solid-state image sensor of the third embodiment is formed on a semiconductor substrate 101, and has an image sensing region 10 and pad region 20. The image sensing region 10 includes photoelectric converters 102, a wiring structure 110, a first organic portion 130, a color filter layer 140, a second organic portion 150, a microlens 420, and an inorganic film 170. The photoelectric converters 102 are formed on the semiconductor substrate 101. The wiring structure 110 is arranged on the photoelectric converters 102, and includes a plurality of wiring layers although not shown. The first organic portion 130 is arranged on the wiring structure 110. The color filter layer 140 is arranged on the first organic portion 130. The second organic portion 150 is arranged on the color filter layer 140. The microlens 420 is arranged on the second organic portion 150. The inorganic film 170 is formed on the microlens 420 and functions as an antireflection film.

The pad region 20 has a wiring structure 110 including a pad electrode 120. The wiring structure 110 of the image sensing region 10 and that of the pad region 20 can have a common interlayer insulating film. The pad region 20 also includes an organic film 480 arranged on the pad electrode 120, and a cover film (inorganic film) 175 which is arranged on the organic film 480 and is made of the same material as the inorganic film 170. In the organic film 480 and cover film 175, an opening OP required to expose the pad electrode 120 is formed.

A depth d of an upper face of the pad electrode 120 with respect to that of the organic film 480 is larger than a total (t1+t2) of a thickness to of the first organic portion 130 and a thickness t2 of the second organic portion 150. That is, a relation d>t1+t2 holds. To hold such relation is advantageous to reduce a probability of causing an insulation breakdown of the organic film 480 to damage the pad electrode 120 in an etching process required to form the opening OP in the organic film 480 and cover film 175. The depth d is preferably, for example, not less than 1 µm.

A distance between an outer edge of the pad electrode 120 and that of the organic film 480 in a planar view is preferably not less than 1 µm. Note that the outer edge of the organic film 480 can be defined as that of a region which satisfies d>t1+t2.

The organic film 480 can include a first portion 135, a second portion 155 arranged on the first portion 135, and a third portion 425 arranged on the second portion 155. In the example shown in FIG. 3F, the second portion 155 is arranged to contact the first portion 135.

Although not shown, the organic film 480 may include the color filter layer 140 in place of all or some of the first, second, and third portions 135, 155, and 425 or in addition to the first, second, and third portions 135, 155, and 425. The first portion 135 can be made of the same material as the first organic portion 130. The second portion 155 can be made of the same material as the second organic portion 150. The third portion 425 can be made of the same material as the microlens 420. The first portion 135 can be formed simultaneously with the first organic portion 130. The second portion 155 can be formed simultaneously with the second organic portion 150. The third portion 425 can be formed simultaneously with the microlens 420.

The first organic portion 130 and first portion 135 can be coupled via a portion made of the same material as that which forms them. The second organic portion 150 and second portion 155 can be coupled via a portion made of the same material as that which forms them.

The inorganic film 170 and cover film 175 can be made of silicon oxide or silicon nitride. Alternatively, the inorganic film 170 and cover film 175 may include a plurality of films. The plurality of films can include, for example, a silicon oxide film and silicon nitride film.

A method of manufacturing the solid-state image sensor according to the third embodiment will be exemplarily explained below with reference to FIGS. 3A to 3F. In a process shown in FIG. 3A, a structure ST which includes the photoelectric converters 102 formed in the image sensing region 10 and the pad electrode 120 formed in the pad region 20 is prepared. In this case, the photoelectric converters 102 are formed in the semiconductor substrate 101, and the pad electrode 120 is formed in the wiring structure 110 arranged on the semiconductor substrate 101.

In the process shown in FIG. 3A, a first organic film 137 which includes the first organic portion 130 arranged in the image sensing region 10 and the first portion 135 in the structure ST is formed in the image sensing region 10 and pad region 20. The first organic film 137 functions as a planarizing layer. The first organic film 137 can be made of, for example, an acrylic-based resin. In the process shown in FIG. 3A, the color filter layer 140 is formed on the first organic portion 130 of the first organic film 137. In this case, the color filter layer 140 may be formed on the first portion 135 of the first organic film 137. In the process shown in FIG. 3A, an organic film 157 is formed in the image sensing region 10 and pad region 20 so as to cover the color filter layer 140. The organic film 157 includes the second organic portion 150 arranged on the color filer layer 140 on the image sensing region 10 and the second portion 155 arranged in the pad region 20. The organic film 157 functions as a planarizing layer. The organic film 157 can be made of, for example, an acrylic-based resin.

In a process shown in FIG. 3B, a microlens layer 427 is formed on the organic film 157. The microlens layer 427 includes the microlens 420 arranged in the image sensing region 10, and the third portion 425 arranged in the pad region 20. The microlens layer 427 can be made of, for example, a polyhydroxystyrene-based resin. Since the microlens layer 427 is made of an organic substance, a stacked structure of the organic film 157 and microlens layer 427 can be recognized as a second organic film 429. Also, a stacked structure configured by the first portion 135, the second portion 155 arranged on the first portion 135, and the third portion 425 arranged on the second portion 155 can be recognized as an organic film 480. The microlens layer 427 can be formed by a reflow method.

In a process shown in FIG. 3C, an inorganic film 177 is formed on the microlens layer 427. That is, in the process shown in FIG. 3C, the inorganic film 177 is formed to cover the second organic film 429 formed by the organic film 157 and the microlens layer 427. The inorganic film 177 includes the inorganic film 170 arranged in the image sensing region 10 and the cover film 175 arranged in the pad region 20. The inorganic film 177 can be made of, for example, silicon oxide or silicon nitride. Alternatively, the inorganic film 177 may include a plurality of films. The plurality of films can include, for example, a silicon oxide film and silicon nitride film.

In a process shown in FIG. 3D, a resist pattern 440 is formed on the inorganic film 177. In a process shown in FIG. 3E, using the resist pattern 440 as an etching mask, the inorganic film 177, second organic film 429, and first organic film 137 are etched to form the opening OP which communicates with the pad electrode 120.

In this case, the inorganic film 177 is etched by plasma etching. The plasma etching of the inorganic film 177 can comply with, for example, conditions 1 below:
<Conditions 1>
Etching gas: $CF_4/Ar$
Power: 200 to 1,500 (W)
Pressure: 30 to 230 (mTorr)
Time: 40 to 120 (sec)

According to conditions 1, the etching can be stopped at the upper face of the second organic film 429. Alternatively, the etching may be stopped after an elapse of a predetermined period of time.

The second organic film 429 and first organic film 137 are also preferably etched by plasma etching. The plasma etching of the second organic film 429 and first organic film 137 can comply with, for example conditions 2 below. However, the second organic film 429 and first organic film 137 may be etched by another etching method such as wet etching.
<Conditions 2>
Etching gas: $O_2/N_2/Ar$
Power: 300 to 1,500 (W)
Pressure: 1,000 to 2,000 (mTorr)
Time: 120 to 250 (sec)

According to conditions 2, the etching is stopped at the pad electrode 120. Alternatively, the etching may be stopped after an elapse of a predetermined period of time. After that, the resist pattern 440 is removed. As a result, the solid-state image sensor shown in FIG. 3F is obtained.

As an application example of the solid-state image sensor according to the above embodiments, a camera which incorporates the solid-state image sensor will be exemplarily explained below. A concept of a camera includes not only an apparatus primarily intended to image sensing but also an apparatus which secondarily includes an image sensing function (for example, a personal computer and mobile terminal). The camera includes the solid-state image sensor according to the present invention exemplified as the embodiments, and a processing unit which processes signals output from the solid-state image sensor. The processing unit can include, for example, an A/D converter and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-136304, filed Jun. 15, 2012, which is hereby incorporated by reference herein in its entirety.

What is claimed is:

1. A method of manufacturing a solid-state image sensor including an image sensing region and a pad region, the method comprising the steps of:
    preparing a structure including a photoelectric converter formed in the image sensing region and a pad electrode formed in the pad region;
    forming a first organic film including a first organic portion arranged in the image sensing region of the structure in the image sensing region and the pad region;
    forming a color filter layer on the first organic portion;
    forming a second organic film in the image sensing region and the pad region so as to cover the color filter layer;
    forming an inorganic film in the image sensing region and the pad region so as to cover the second organic film; and
    etching the inorganic film, the second organic film, and the first organic film so as to form an opening which communicates with the pad electrode,
    wherein, in the step of etching the inorganic film, the second organic film, and the first organic film, at least the inorganic film is etched by plasma etching,
    wherein the second organic film includes a second organic portion arranged in the image sensing region to cover the color filter layer, a microlens arranged on the second organic portion, and a portion arranged in the pad region, and
    wherein a distance from an upper face of the second organic film to an upper face of the pad electrode in the pad region is larger than a total of a thickness of the first organic portion and a thickness of the second organic portion.

2. The method according to claim 1, wherein the step of forming the second organic film comprises the step of forming a part of the portion of the second organic film and the second organic portion, and the step of then forming another part of the portion of the second organic film and the microlens.

3. The method according to claim 1, wherein the step of forming the second organic film comprises the step of forming an organic film and then etching the organic film to form the microlens.

4. The method according to claim 1, wherein the inorganic film functions as an antireflection film in the image sensing region.

5. A solid-state image sensor including an image sensing region and a pad region,
    wherein the image sensing region includes a photoelectric converter, a wiring structure arranged on the photoelectric converter, a first organic portion arranged on the wiring structure, a color filter layer arranged on the first organic portion, a second organic portion arranged on the color filter layer, a microlens arranged on the second organic portion, and an inorganic film arranged on the microlens,
    wherein the pad region includes a pad electrode, an organic film arranged on the pad electrode, and a cover film which is arranged on the organic film and is made of the same material as the inorganic film, and wherein a distance from an upper face of the organic film to an upper face of the pad electrode is larger than a total of a thickness of the first organic portion and a thickness of the second organic portion.

6. The sensor according to claim 5, wherein the organic film includes a first portion made of the same material as the first organic portion, a second portion which is arranged on the first portion and is made of the same material as the second organic portion, and a third portion which is arranged on the second portion and is made of the same material as the microlens.

7. The sensor according to claim 6, wherein the second portion contacts the first portion.

8. The sensor according to claim 6, wherein the first organic portion and the first portion are coupled via a portion made of the same material as a material which forms the first organic portion and the first portion, and the second organic portion and the second portion are coupled via a portion made of the same material as a material which forms the second organic portion and the second portion.

9. The sensor according to claim 8, wherein the microlens and the third portion are coupled via a portion made of the same material as a material which forms the microlens and the third portion.

10. The sensor according to claim 5, wherein the second organic portion and the microlens are made of different materials.

11. The sensor according to claim 5, wherein the second organic portion and the microlens are made of the same material.

12. The sensor according to claim 5, wherein the organic film includes a film made of the same material as the color filter layer.

13. The sensor according to claim 5, wherein the inorganic film and the cover film are made of silicon oxide.

14. The sensor according to claim 5, wherein the inorganic film and the cover film, each includes a plurality of films.

15. The sensor according to claim 14, wherein the plurality of films include a silicon oxide film and a silicon nitride film.

16. The sensor according to claim 5, wherein the depth of the upper face of the pad electrode with resect to the upper face of the organic film is not less than 1 μm.

17. The sensor according to claim 5, wherein a distance between an outer edge of the pad electrode and an outer edge of the organic film in a planar view is not less than 1 μm.

18. The sensor according to claim 5, wherein the inorganic film functions as an antireflection film in the image sensing region.

19. A camera comprising:
a solid-state image sensor of claim 5; and
a processing unit which processes a signal output from said solid-state image sensor.

* * * * *